United States Patent [19]

Clark et al.

[11] Patent Number: 4,675,531

[45] Date of Patent: Jun. 23, 1987

[54] OPTICAL SCANNER HAVING A MULTI-SURFACED LENS ARRANGEMENT FOR PRODUCING A ROTATIONALLY SYMMETRIC BEAM

[75] Inventors: Peter P. Clark, Acton; William T. Plummer, Concord, both of Mass.

[73] Assignee: Polaroid Corporation, Cambridge, Mass.

[21] Appl. No.: 717,517

[22] Filed: Mar. 28, 1985

[51] Int. Cl.⁴ .............................................. G06K 7/10
[52] U.S. Cl. .................................... 250/568; 235/472
[58] Field of Search .......................... 235/472; 382/59; 250/227, 568, 216

[56] References Cited

U.S. PATENT DOCUMENTS

| | | | |
|---|---|---|---|
| 3,784,794 | 1/1974 | Alais | 235/61.11 |
| 3,870,865 | 3/1975 | Schneiderhan et al. | 250/566 |
| 3,916,184 | 10/1975 | Turner et al. | 250/227 |
| 4,074,114 | 2/1978 | Dobras | 250/555 |
| 4,115,703 | 9/1978 | Dobras | 250/568 |
| 4,143,809 | 3/1979 | Uebbing et al. | 235/472 |
| 4,346,292 | 8/1982 | Routt, Jr. et al. | 250/216 |
| 4,603,262 | 7/1986 | Eastman et al. | 250/566 |

Primary Examiner—David C. Nelms
Assistant Examiner—William L. Oen
Attorney, Agent, or Firm—Francis J. Caufield

[57] ABSTRACT

An optical element that is particularly suitable for use in the optical system of a hand-held probe to conduct light to and from bar codes as they are scanned or read for information. The element preferably is integrally formed as a single piece fabricated of optical plastic by injection molding and includes three surfaces, one of which in preferred form is decentered with respect to the element optical axis and forms with another surface an opposed pair used to control the output of a source to illuminate bar codes. The remaining surface, the third, is prismatic, either converging or diverging as required, and is structured to cooperate with part of one of the paired opposed surfaces to conduct light reflected from a bar code to a small photodetector for conversion to electrical form. Overcorrected spherical aberration is used to control the intensity, depth, and surface coverage of illumination so that the probe performance does not change for bar codes positioned anywhere throughout a predetermined working depth.

28 Claims, 5 Drawing Figures

OPTICAL SCANNER HAVING A MULTI-SURFACED LENS ARRANGEMENT FOR PRODUCING A ROTATIONALLY SYMMETRIC BEAM

BACKGROUND OF THE INVENTION

This invention relates generally to the field of optical scanning or reading and specifically to the structure of an optical system that is particularly suitable for use in a hand-held probe for scanning bar codes.

The use of bar codes to provide information on product prices, identity, and inventory levels is a well-established practice in retail businesses and elsewhere because bar codes are convenient, inexpensive, and lend themselves well to semi or full automation reading techniques.

In bar codes, information is stored as alternating dark and light stripes, the width and spacing of which are used as a means of encoding. When properly illuminated with a small enough beam of light, they return a modulated reflected beam of light which, if sufficiently intense, can be detected and converted to electrical form for decoding purposes. Usually, the bar code is scanned with a beam of illumination and the reflected beam simultaneously detected with an optical system of sufficient resolution. During scanning, the bar code is moved relative to the detection system, and relative motion is achieved by either moving the coded product relative to a fixed scanning head, most often seen in a supermarket, or by moving a hand-held probe over the code on the product, more often seen in lower volume retail situation.

The performance of hand-held probes should be reasonably insensitive to their rotational and angular attitudes and, as well, to their proximity to a bar code because such positional variations are to be expected in hand operations. In addition, signal strength, resolution, noise level, and ease and cost of fabrication are important considerations in the design and manufacture of scanners, whether hand-held or fixed types.

Prior art hand-held probe devices have included fiber optic illumination systems along with a lens system that is structured to focus reflected light onto a sensing module as shown, for example, in U.S. Pat. No. 3,916,184 issued to Thomas W. Turner on Oct. 28, 1975 and entitled "Optical Scanner in Modular Form". In U.S. Pat. No. 3,784,794 issued to David C. Allais on Jan. 8, 1974 and entitled "Electro-Optical Reader for Bar Codes or the Like", a hand-held probe is disclosed which utilizes as an optical system, for both the illumination and detection of reflected light from the bar code, a spherical lens on the rear surface of which is positioned either one or more detectors.

A dual focusing system for use in a hand-held bar code probe is disclosed in U.S. Pat. No. 4,143,809 issued to John J. Uebbing et al on Mar. 13, 1979 and entitled "Optical Bar Code Reader". Here, a pair of discrete lenses are integrally molded aside of one another as part of a support with their optical axes intersecting at a predetermined acute angle. The surfaces of the lenses are in the form of hyperbolic sections that are selectively shaped to eliminate spherical aberration.

In spite of the many innovations made in this art, improved hand-held bar code probes are still required and can be usefully employed for a variety of purposes. In particular, optical systems are required for use in hand-held probes to provide signals of high strength and low noise while at the same time being able to resolve to levels required in a variety of positions and spacings from the bar code. Furthermore, ease and efficiency of manufacture and the use of simple structures are important considerations in the design of bar code scanners. Accordingly, it is the primary object of the present invention to provide an optical system for use in the hand-held bar code probe having the above beneficial characteristics.

Other objects of the invention will, in part, be obvious and will, in part, appear hereinafter. The invention accordingly comprises the structure exemplified in the detailed disclosure which follows.

SUMMARY OF THE INVENTION

This invention relates generally to the field of optical scanning and specifically to the structure of an optical element that is particularly suitable for use in a hand-held probe to conduct light to and from bar codes as they are scanned for their information content. The optical element itself preferably is integrally formed as a single piece fabricated of optical plastic by injection molding. The preferred form of the element has just three surfaces, two of which form a first coacting pair that are structured to jointly redistribute light from an offset divergent source as a beam of illumination having a uniform intensity over a detector image throughout a range of focus of the coacting pair corresponding to a predetermined working distance for the probe. This assures minimum signal strength when reading bar codes anywhere in the working distance. To accomplish this, one of the pair of coacting surfaces is provided with a shape having overcorrected spherical aberration.

A third surface, prismatic and converging or diverging as required, cooperates with part of one of the first coacting pair of surfaces to collect and direct light reflected from a bar code anywhere in the working distance onto an offset photodetector located behind the element on the same side as the source and preferably in the same plane.

Other embodiments of the invention include four surfaces instead of three and some operate with source and detector located in tandem along a central axis instead of offset with respect to the central axis as in the preferred case. All embodiments, however, are rotationally symmetric and relatively insensitive to axial proximity and angular attitude to the bar code during scanning.

BRIEF DESCRIPTION OF THE DRAWINGS

The novel features that are considered characteristic of the invention are set forth with particularity in the appended claims. The invention itself, however, both as to its organization and method of operation, together with other objects and advantages thereof, will be best understood from the following description of the illustrated embodiments when read in connection with the accompanying drawings wherein like numbers have been employed in the different figures to denote the same parts and wherein:

DETAILED DESCRIPTION

Figure 1:
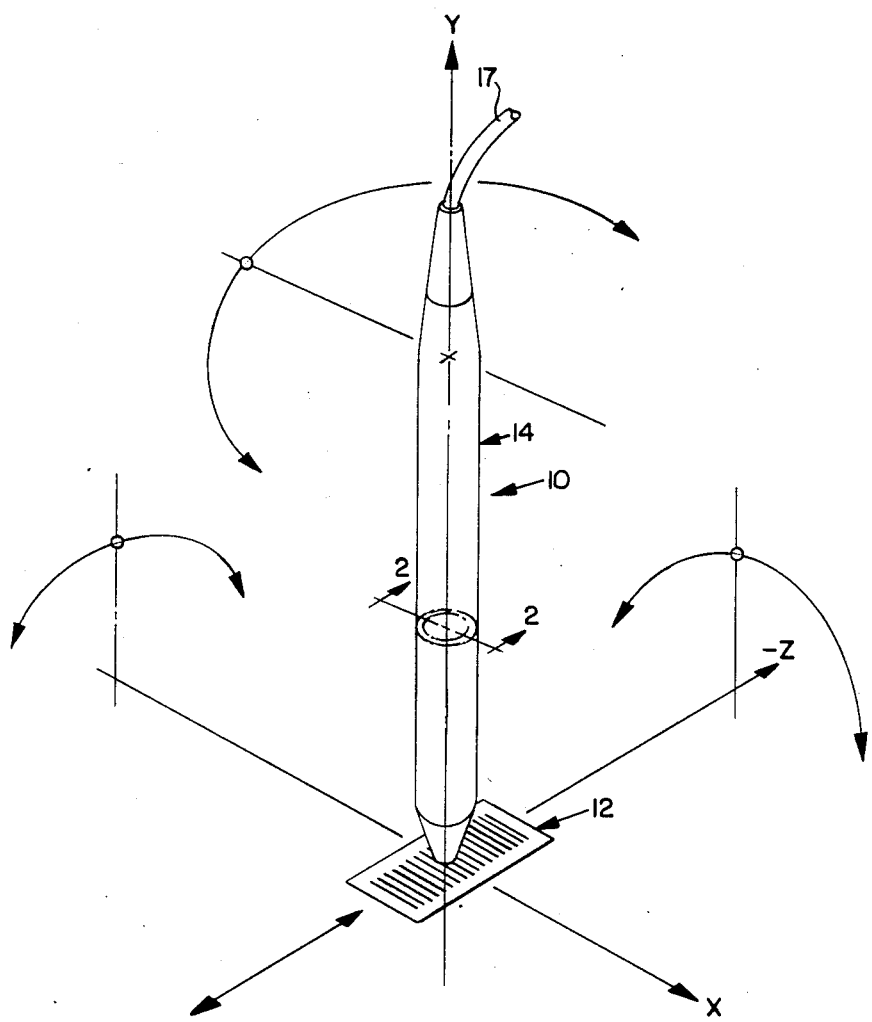
FIG. 1 is a diagrammatic perspective view of a hand-held probe of the type in which the optical element of the invention can be usefully employed and shows the various attitudes in which the probe can be used to read a bar code.

In FIG. 1, there is shown generally at 10 a probe or reader that is representative of the type with which the present invention is particularly suitable for use. As seen, probe 10 comprises a slender elongated housing 14 which has conical tapers at both ends. The top conical end terminates in a cable 17 that leads to a cash register or the like to which information from probe 10 is transmitted for further use. Probe 10 is pencil like in scale and, as such, is operated by manually passing its other conical end over a bar code, such as that designated at 12, to "read" the bar code. Consequently, the angular attitude of probe 10 with respect to the bar code 12 can be made to vary in three azimuths, i.e., pitch, roll and yaw as indicated in FIG. 1 by the curved double-headed arrows, where pitch is about the Z-axis, roll about the X-axis, and rotation about the Y-axis. In addition, the separation of the bottom conical end of probe 10 from the bar code 12 can also vary in the Y direction and as well in the X and Z plane. Because of this inevitable variation in motion due to hand-held operation, it is important that the performance of such probes be relatively insensitive to expected positional changes. That is, the output of the probe 10 shouldn't, within reasonable limits, change as a function of the angular attitude or proximity of the probe to a bar code 12. In practical terms, this means that probe 10 must provide a minimum signal strength with adequate signal-to-noise ratio for pitch and roll angles over some reasonable range from, say, 0° to approximately 50°, and this performance should not change with rotation of the probe 10 about the Y-axis or with displacement of the probe from the bar code 12 by some prescribed separation or working distance on the order of a few tenths of an inch or less.

The optical element of the invention satisfies these requirements with minimal structure easily fabricated using plastic injection molding techniques for high volume efficiency. To understand the present invention, reference is now made to FIG. 2 which is a section taken generally along line 2—2 of FIG. 1 and showing the optical element of the invention, designated generally at 16, along with other components which reside in the interior of the probe body 14. The lower conical end of the probe body 14 terminates in an aperture 15 which may conveniently be closed over with a transparent dust cover to keep foreign matter out of the interior of the probe body 14. It is the general purpose of the optical element 16 to conduct light in a controllable way to and from the bar code 12 by way of the aperture 15. In doing so, the optical element 16 facilitates providing a beam of light for reflection from a nearby bar code to generate a modulated light beam and conducts the modulated light beam to a small photodetector for decoding purposes.

Figure 2:
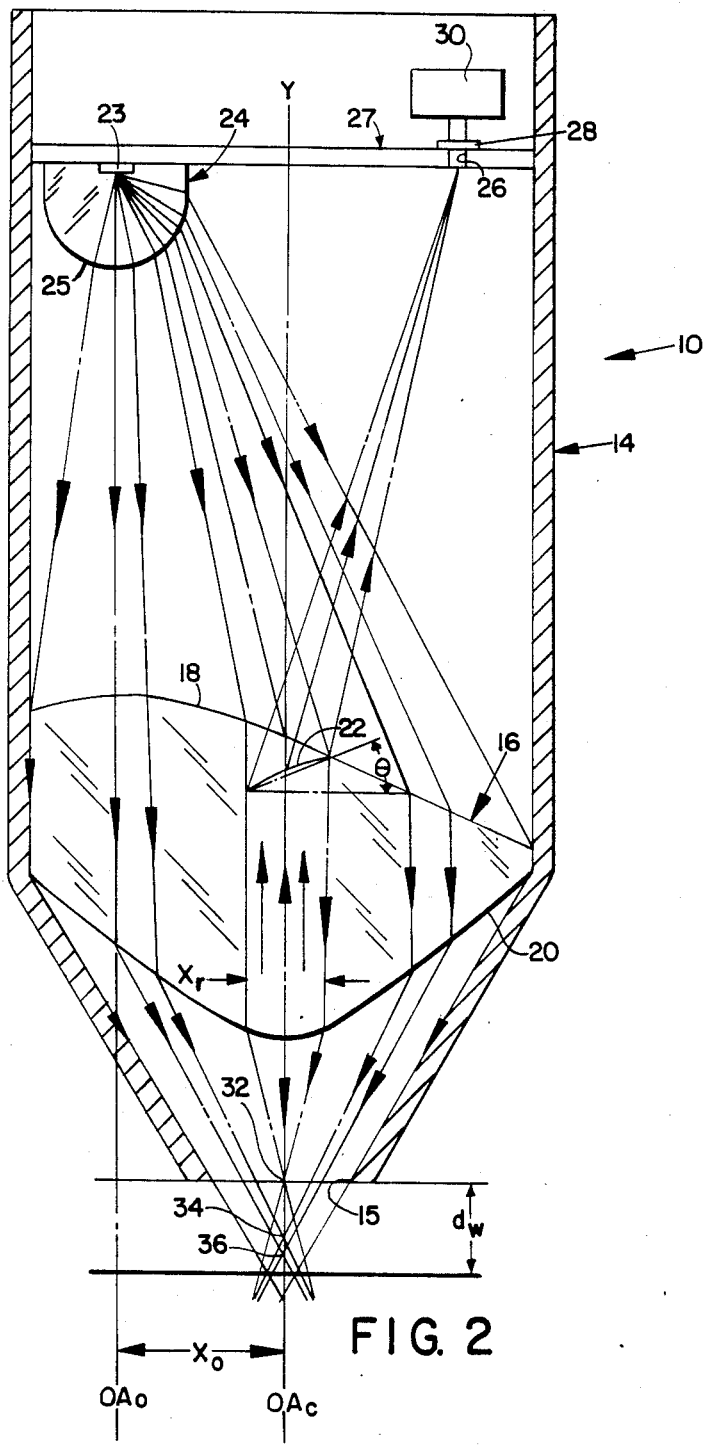
FIG. 2 is an enlarged cross-sectional view of the probe of FIG. 1 taken generally along line 2—2 of FIG. 1 and illustrates the preferred embodiment of the invention.

To perform its functions, the optical element 16 has a rear surface 18 which is aspheric and preferably hyperboloidal. The rear surface 18, as can be seen in FIG. 2, is rotationally symmetric about an axis, $OA_o$, which in turn is offset by a distance, $X_o$, with respect to the central axis of the probe 10, $OA_c$, coincident with the Y-axis. Consequently, the rear surface 18 is known as a decentered surface and thus has a well-known prism effect.

Facing rear surface 18 is a front surface 20 which is also aspheric, preferably strongly hyperboloidal in form. Front surface 20 is of stronger curvature, and therefore of stronger power than the rear surface 18 and is rotationally symmetric about the optical axis, $OA_c$.

In the center of the rear surface 18, there is a slight depression in which is found another surface, the third surface of the optical element 16, and this surface is designated generally at 22. As can be seen, the surface 22 is of diameter, $X_r$, is preferably rotationally symmetric and, although shown as a convex surface, may also be concave if required, and could conveniently be the same shape as that of the surface 18. Surface 22 is superimposed on a prism that is at an angle, $\theta$, with respect to the optical axis, $OA_c$.

Behind the optical element 16, there is an electronic subassembly 27 which includes a source of illumination 24 and a photodetector 28 along with its associated electronics 30, both of which are mounted on a board preferably perpendicular to the optical axis $OA_c$ and each of which is aligned with an axis that is offset with respect to the optical axis $OA_c$.

The source 24 comprises an active radiation emitting area 23 over which is positioned a hemispherical lens 25 which accepts radiation from the active area 23 and generally converges it as indicated with the arrowed rays shown in FIG. 2. The central axis of the hemisphere 25 is preferably on the offset optical axis, $OA_o$, and therefore is centered with respect to the rear surface 18. The operational wavelength of the light source 24 is within the range including the visible as well as the IR portion of the spectrum and the overall integrated output intensity of the source 24 may be as high as several milliwatts.

Considering light travelling from the source 24 to the bar code 12, top to bottom in FIG. 2, it first encounters the rear surface 18 and, because of the shape of this surface, gets collimated, i.e., afterwards travels parallel within the optical element 16. As seen, the collimated bundle of rays provided by the rear surface 18, as well as travelling parallel to one another, also travel parallel to the optical axis, $OA_c$. Afterwards, this collimated light is refracted by the front surface 20 so that rays which are near the optical axis, $OA_c$, are focused on-axis near the center of the aperture 15 as designated generally by the point 32. Light rays further off of the optical axis, $OA_c$, are progressively focused further below the focus location for the near axial rays as shown, for example, at the focus points 34 and 36 for those rays displaced further off the optical axis, $OA_c$. Notice that, after rays are converged on-axis, they diverge beyond their focus points (32, 34 and 36) to become available downstream of their respective focus points as light useful for illuminating off-axis downstream points. Consequently, sections through the beam of illumination, taken perpendicular to the optical axis, within some working depth, say $d_w$, reveal a pattern, circular in overall shape, in which light intensity is more or less of one level because of the way in which the illumination from the source 24 is redistributed by the optical element 16. In addition, the illumination is also uniform over each circular section, which are generally not of the same size, but are made to coincide, or nearly so, with the detector image over the working distance as will be appreciated. This control of illumination in depth is brought about by the shape of the front surface 20 which, in its preferred form, is strongly hyperboloidal and of greater eccentricity than that of the rear surface 18. The shape of surface 20 is chosen so that it intentionally contributes overcorrected spherical aberration that produces the desired constant illumination level with depth, a property which allows one to have a constant signal strength wherever the bar code 12 is located within this distance, preferably about 0.15 inch.

The fact that the mechanical axis of the probe 10 and the optical axis, $OA_c$, of the front surface 20 are coincident is an important feature because this makes the system rotationally symmetric and therefore, the bar code 12 can be decoded the same regardless of the rotational attitude of the probe 10. This rotational symmetry is possible because the rear surface 18 collimates and has its axis of symmetry decentered with respect to the optical axis, $OA_c$. This, in turn, allows the light source 24 to be physically displaced to one side of the optical axis, $OA_c$.

For light travelling in the other direction, that is, bottom to top in FIG. 2, in the direction of light reflected from the bar code 12, such light is first collimated by the front surface 20 and can be considered to be composed of two segments, the first hitting the wedged surface 22 in the rear surface 18 and the second what goes on to hit the rear surface 18.

The first segment of this light, which is a light within the extreme bundle of rays intercepted by the diameter, $X_r$, is bent by the wedge surface 22 and afterwards, because of the net power of the surface 22 coacting with part of the front surface 20, is converged so that it passes through the aperture 26 located forward of the photodetector 28. This light is converted to electrical form by the photodetector 28 for decoding in a known manner by the electronics 30.

It will be understood that the image of the photodetector 28, as seen through the aperture 26, from the vantage of the bar code 12 has to be small enough to fit between alternate black and white pairs of the code 12 to be able to know when a black/white boundary has been crossed. If these conditions were not satisfied and the bar code 12 were fine enough, i.e., of high spatial frequency, the output would be relatively level since everything would look gray, the average of black and white, and therefore there would be no modulaton present.

The final area of the photodetector image is preferably centered within the working distance, $d_w$, by placing the paraxial image midway, but the paraxial image can be placed at any other reasonable location throughout the working distance, $d_w$. It will be understood that wherever the photodetector paraxial image is, the photodetector image size on either side of this location will be larger due to defocus so that there exists some core, either converging or diverging, depending on the perspective in which the detector image resides.

Because the photodetector image size in general changes throughout the working distance, one might think that the signal strength also changes. However, this is not the case because the illumination over the photodetector image throughout the working distance, $d_w$, is uniform and more or less of equal intensity. Because of this property and the fact that the f-number to the photodetector 28 remains constant with defocus, the signal strength also remains constant or reasonably so.

An example of an optical element which has been found suitable for use in a bar code probe of about 3/10 of an inch in diameter is the following. The rear surface 18 and the front surface 20 are both described by the general formula:

$$Y = \frac{CS^2}{1 + \sqrt{[1 - (1 + K) C^2 S^2]}} + \beta S^4 + \gamma S^6 + \delta S^8 + \epsilon S^{10}$$

where C is the reciprocal of the surface apex radius, K the conic constant, Y the distance of a point measured from the surface vertex and parallel to the Y-axis, taken to be the surface's optical axis, and S is the radial distance of the point measured perpendicular to the Y-axis and wherein the coefficients $\beta$ through $\epsilon$, are given in the following table:

| Surface | 18 | 20 |
|---|---|---|
| C | 5.683 | 16.0 |
| K | −2.22 | 2.67 |
| $\beta$ | 0.0 | 1.3 |
| $\gamma$ | 0.0 | 56.0 |
| $\delta$ | 0.0 | $2.5 \times 10^3$ |
| $\epsilon$ | 0.0 | $1.1 \times 10^5$ |

For these values, the distance from the aperture 15 to the apex of the front surface 20 was 1.4 inches, and the separation between the apex of front surface 20 and the rear surface, measured along the optical axis $OA_c$, was 0.3 inch with the diameter of the element being approximately 0.32 inch. The material was Plexiglas ™.

With this example, tests have indicated that as probe 10 is brought in towards the bar code from the working distance of 0.15 inch, the output signal does not vary from nominal by more than ±15% up to the point of contact with the bar code, and the output level is independent of the probe angle of rotation and does not vary over all operational angles or distances from the bar code by more than a factor of 2 to 1 for angles within the range from 0° to 40°. The distance to the offset axis, $OA_o$, i.e. $X_o$, was approximately 0.1 inch and slightly less on the photodetector offset. The paraxial image size of the photodetector was 0.0006 inch midway along the working distance and the f-number of the photodetection system was f/6.0 while that of the illumination system was f/0.6. Spatial frequencies of 0.357 line pairs/mm were easily resolved. It will be realized by those skilled in the art that for optimum resolution, the detector image size thoughout the working distance, $d_w$, should be no more than one-half the highest expected bar code frequency.

Figure 3:
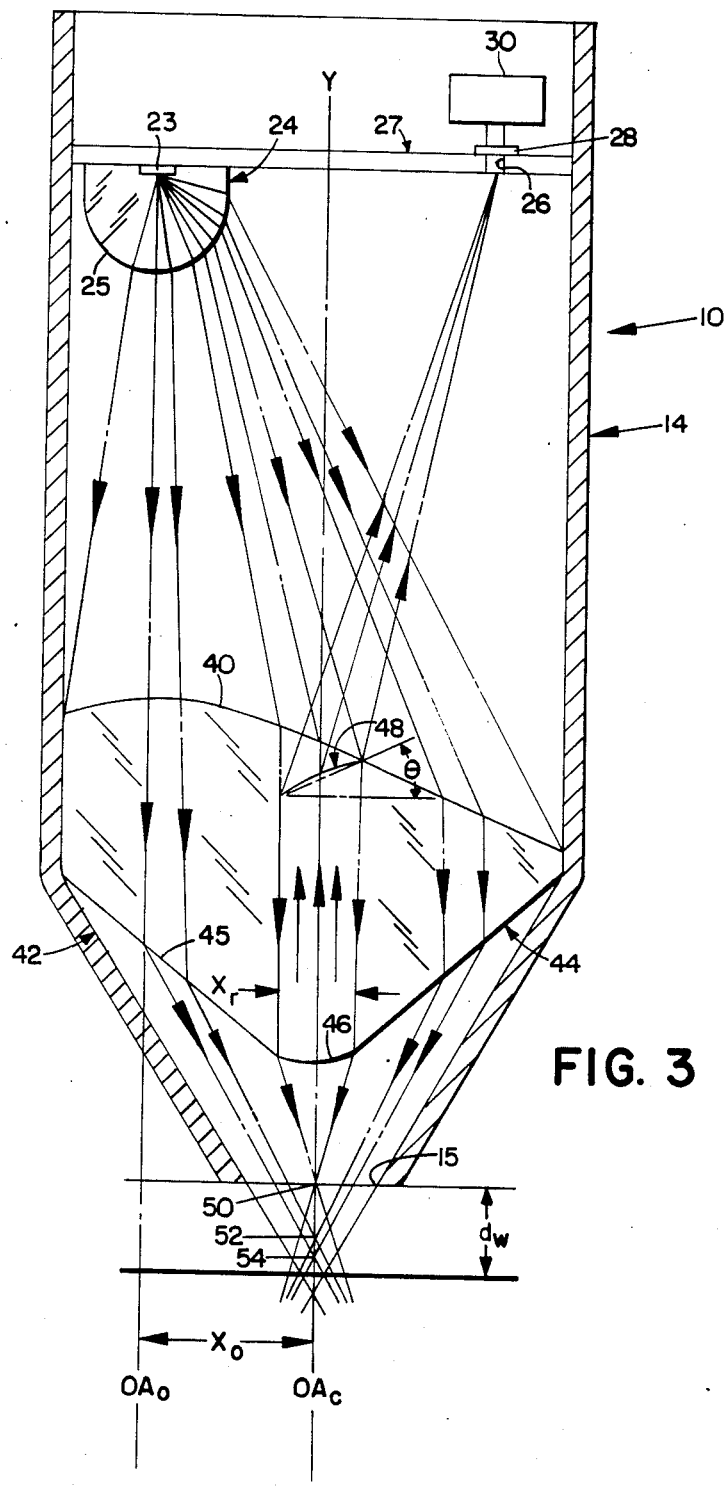
FIG. 3 is a section similar to FIG. 2 and illustrates an alternate embodiment of the invention.

In FIG. 3 is shown an alternate embodiment for the optical element of the invention, and this embodiment is designated generally at 42. The element 42 in principle functions the same as the previous element 16, but differs in surface detail comprising a new rear surface 40 and a different front surface 44. Also, there is included in a depressed region in the rear surface 40 a rearwardly facing surface 48. All of the other parts shown in FIG. 3 retain the same numerical identification they had in FIG. 2 with the exception of the points of convergence which are now designated at 50, 52 and 54 because they may slightly differ from those shown previously.

The front surface 44 instead of being hyperboloidal as before, is now comprised of two intersecting sections, one of which is a straight conical section designated generally at 45 and the other of which is an aspheric section joined to the conical section 45 and designated generally at 46. Thus, the surface 44, while continuous, is comprised of two intersecting parts having different geometries. Because the surface 44 is different than previously, the surface 40, while still hyperboloidal will have slightly different characteristics than its correspondent before in order to collimate the bundle of diverging rays from the source 24.

A major difference between this element and the previous element is that in this element, the collecting system no longer uses part of the front surface to return light to the photodetector 28, but now rather is formed of a cooperative pair which includes the front surface segment 46 and the rear wedge segment 48. The wedge segment 48 is in shape aspheric and either positive or negative as required. In addition, the surface 48 is provided with a prismatic effect by virtue of its overall angular orientation with respect to the optical axis $OA_c$. This prismatic effect is responsible for diverting the bundle of rays emerging from the surface 48 through an angle, $\theta$, appropriate to direct light to enter the aperture 26.

Again, the front surface conical segment 45 operates to provide overcorrected spherical aberration so that the energy from the source 24 is redistributed to provide a beam which is uniform over the image of the photodetector throughout the working distance, $d_w$.

Figure 4:
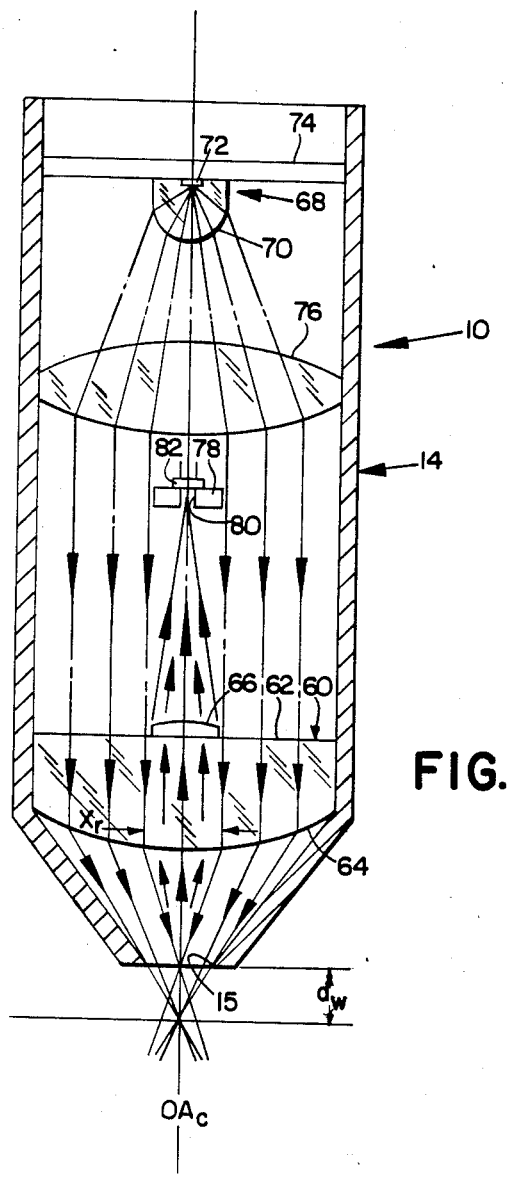
FIG. 4 is a view similar to FIG. 2 and illustrates yet another embodiment of the invention.

In FIG. 4, there is shown yet another embodiment of the invention, and this optical element is designated generally at 60. In this figure, however, the light source, which is designated at 68, and the photodetector, which is designated at 82, are located in tandem, one behind the other, along the optical axis, $OA_c$. Again, the light source 68 is preferably an LED having an active area 72 from which radiation emanates and is thereafter converged by use of a hemispherical lens 70 which sits registered on top of the area 72. Diverging rays from the light source 68 are converged in a well-known manner through the use of a converging lens 76 which is structured to collimate or provide a collimated beam of radiation emerging from the element 76. This collimated beam of radiation emerging from the optical element 76 strikes the rear surface of the optical element 60 which is plano and generally designated at 62. Therefore, since the plano surface 62 does not deviate the collimated bundle of radiation, it continues on through the optical element 60 in a collimated state. Afterwards, the collimated radiation travelling through the element 60 encounters front surface 64 which is again made hyperboloidal in shape to converge the collimated bundle of radiation travelling along the optical axis, $OA_c$, and redistribute it as a beam afflicted with overcorrected spherical aberration so that the intensity and surface coverage of the beam is uniform over the image of the photodetector throughout the working length, $d_w$.

At the center of the rear plano surface 62, there is provided a converging surface 66 which cooperates with part of the front surface 64 having a diameter designated again by $X_r$ to converge the reflected beam of radiation from the bar code 12 through an aperture 80. Afterwards, the beam strikes the photodetector 82 to provide an appropriate modulated signal for decoding. The major difference between this embodiment and those previously discussed is that in this embodiment the source and detector are located on-axis and tandemly spaced from one another and the optical element 60 operates on a collimated beam of radiation which is provided by an upstream optical element 76, rather than on a diverging source of radiation emanating directly from the light source 68. Consequently, the rear surface of the optical element 60 is not provided with any power to provide a collimated beam since this has already been done previously. Otherwise, the performance of this system is similar to that of those previously discussed, particularly with respect to rotational symmetry and consistency of signal output with changes in positional attitude.

Figure 5:
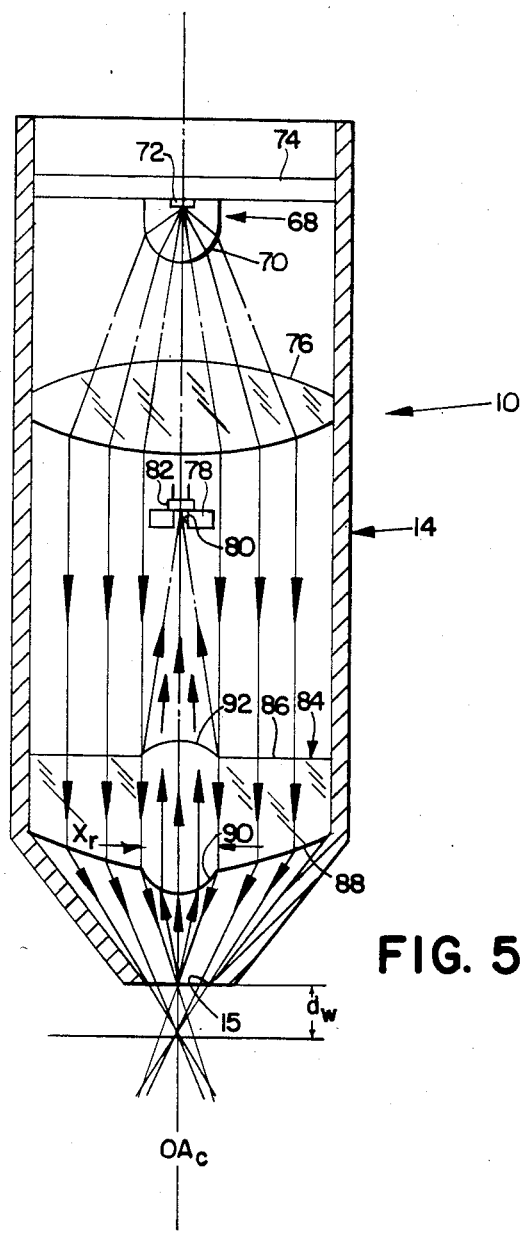
FIG. 5 is also similar to FIG. 2, illustrating still another embodiment of the invention.

FIG. 5 shows yet another embodiment of the optical element of the invention and here it is designated generally at 84. The optical element 84 is most similar to the optical element previously discussed at 60 in FIG. 4, differing only in the details of its front and rear surface with all other components shown in FIG. 4, retaining their same numerical designation in FIG. 5.

The optical element 84 again includes a planar rear surface 86 having a convex aspheric surface 92 centered with the optical axis, $OA_c$. The front surface of the element 84 consists of two segments of different power, one of which is an outer segment 88 that is aspheric and the other of which is an aspheric segment 90 centered on the optical axis, $OA_c$. Surface 88 as before is structured to introduce overcorrected spherical aberration into the collimated beam to distribute it in intensity in the manner required, and the surfaces 90 and 92 cooperate to collect and direct the reflected beam to the aperture 80 after which it proceeds to the photodetector 82 as before. The major difference between this embodiment and that of FIG. 4 is that here two surfaces are used to collect and direct radiation from the reflected beam onto the photodetector of the system.

It will be obvious to those skilled in the art that changes may be made in the above-described embodiments without departing from the scope of the invention. For example, changes in scale may be effected and slight differences in surface details may be introduced to accommodate variants. Also, slight texturing may be applied to one or another of the surfaces to provide better uniformity of illumination if required. Therefore, it is intended that all matter contained in the above description or shown in the accompanying drawings shall be interpreted as illustrative and not in a limiting sense.

What is claimed is:

1. An optical system for use with an optical reader of the type having a housing in which there is disposed a light sensitive detector and a means of illumination, said optical system comprising a multi-surfaced lens arrangement for directing illumination from the illumination means along a given path at least part of which is outside of the housing to illuminate information presented in said path and for focusing an image of at least portions of the presented information on the detector when said information is presented at locations within a predetermined length along said path, all of said surfaces of said lens arrangement being aligned along a common optical axis and structured for directing said illumination as a rotationally symmetric beam of illumination providing at each location along said predetermined length substantially uniform illumination over a cross-sectional area at least corresponding to the focused area of the information at that location.

2. The optical system of claim 1 wherein all of said surfaces of said lens arrangement are integrally formed in a single element.

3. The optical system of claim 1 wherein said lens arrangement is configured for providing overcorrected spherical aberration to distribute said illumination along said predetermined length.

4. The optical system of claim 2 wherein said lens arrangement utilizes a center portion thereof for focusing said image on said detector and an outer portion, surrounding said center portion, for directing said illumination along said path.

5. The optical system of claim 1 wherein said lens arrangement focuses images defined within a diverging cone extending along said predetermined length and directs said illumination as a diverging beam at least coextensive with said diverging cone.

6. An optical system particularly suitable for use in an optical scanner to control light from a source to provide a beam of light for reflection from a nearby bar code located within a given detector working distance from the scanner to generate a modulated light beam for decoding purposes, said optical system comprising at least one component fabricated as a single piece of optical plastic having integrally formed therein first and second opposed surfaces that are structured and arranged with respect to one another to distribute source light incident on said first opposed surface as a beam of illumination emerging from said second opposed surface where said beam of illumination is over a range of focus of said opposed surfaces, corresponding to the detector working distance, rotationally symmetric and substantially uniform over the detector image throughout said range of focus.

7. The optical system of claim 6 wherein said first opposed surface is further structured to collimate light incident thereon.

8. The optical system of claim 7 wherein said first opposed surface is hyperboloidal in form.

9. The optical system of claim 8 wherein said first opposed surface is decentered with respect to said second opposed surface.

10. The optical system of claim 6 wherein said second opposed surface is aspheric in form.

11. The optical system of claim 6 wherein said range of focus thereof is approximately 0.15 inch.

12. The optical system of claim 6 wherein the f/number thereof is approximately 0.6.

13. The optical system of claim 6 wherein said second opposed surface is formed to have overcorrected spherical aberration.

14. The optical system of claim 13 wherein said first opposed surface is structured to collimate lght from the source.

15. An optical system particularly suitable for use in an optical scanner to control light from a source to provide a beam of light for reflection from a nearby bar code to generate a modulated light beam and to conduct the modulated light beam to a photodetector for decoding purposes, said optical system comprising at least one component fabricated as a single piece of optical plastic having integrally formed therein at least a first surface that is structured and arranged to facilitate focusing the photodetector over a working distance along a given axis of said component so that the size of the image of the photodetector over said working distance is substantially no larger than one-half the highest bar code spatial frequency expected to be decoded, said component further including a pair of opposed surfaces that are structured and arranged with respect to one another and said first surface to distribute source light incident on one of said opposed surfaces as a rotationally symmetric beam of illumination emerging from the other of said opposed surfaces and coaxial with said given axis at least over said working distance, said beam of illumination further being uniform over the photodetector image area throughout the length of said working distance.

16. The optical system of claim 15 wherein said opposed surfaces are decentered with respect to one another.

17. The optical system of claim 15 wherein both of said opposed surfaces are hyperboloidal in cross-sectional shape.

18. The optical system of claim 15 wherein one of said opposed surfaces and said first surface operate in combination to focus the photodetector over said working distance.

19. The optical system of claim 15 wherein one of said opposed surfaces is shaped to collimate light from the source and the other of said opposed surfaces is formed to have over-corrected spherical aberration.

20. The optical system of claim 15 wherein said component first surface and at least part of one of said opposed surfaces operate in combination to collect and concentrate light reflected from a bar code.

21. The optical system of claim 15 wherein said component pair of opposed surfaces are structured to operate with a diverging source of illumination.

22. The optical system of claim 15 wherein the first surface of said optical pair of surfaces first encountered by light from a diverging source collimates such light.

23. An optical system particularly suitable for use in an optical scanner to control light from a source to provide a beam of light for reflection from a nearby bar code located within a given detector working distance from the scanner to generate a modulated light beam for decoding purposes, said optical system comprising at least one component fabricated as a single piece of optical plastic having integrally formed therein a pair of opposed surfaces that are structured and arranged with respect to one another to distribute source light incident on one of said opposed surfaces as a rotationally symmetric beam of illumination emerging from the other of said opposed surfaces where said beam of illumination has, over a range of focus of said component, a nominal intensity which does not vary by more than plus or minus 15 percent from its nominal value and which is uniform over the detector image area throughout the detector working distance.

24. An optical reader comprising:
a housing;
a light sensitive detector mounted within said housing;
means for providing illumination within said housing; and
a lens arrangement for directing illumination from said illumination means along a given path exteriorly of said housing to illuminate information presented in said path and for focusing an image of at least portions of the presented information on said detector when said information is presented at locations within a predetermined length along said path, and said lens arrangement directing said illumination as a rotationally symmetric beam of illumination providing at each location along said predetermined length substantially uniform illumination over a cross-sectional area at least corresponding to the focused area of the information at that location.

25. The reader of claim 24 wherein said lens arrangement is integrally formed.

26. The reader of claim 24 wherein said lens arrangement is configured for providing overcorrected spherical aberration to distribute said illumination along said predetermined length.

27. The reader of claim 24 wherein said lens arrangement utilizes a center portion thereof for focusing said image on said detector and an outer surrounding portion for directing said illumination along said path.

28. The reader of claim 24 wherein said lens arrangement focuses images defined within a diverging cone extending along said predetermined length and directs said illumination as a diverging beam at least coextensive with said diverging cone.

* * * * *